(12) United States Patent
Kubota et al.

(10) Patent No.: US 10,629,556 B2
(45) Date of Patent: Apr. 21, 2020

(54) COMPOSITE BUMP, METHOD FOR FORMING COMPOSITE BUMP, AND SUBSTRATE

(71) Applicant: FUJITSU LIMITED, Kawasaki-shi, Kanagawa (JP)

(72) Inventors: Takashi Kubota, Chikuma (JP); Takayoshi Matsumura, Yokohama (JP); Naoaki Nakamura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/975,813

(22) Filed: May 10, 2018

(65) Prior Publication Data

US 2018/0337156 A1  Nov. 22, 2018

(30) Foreign Application Priority Data

May 16, 2017 (JP) .................. 2017-097530

(51) Int. Cl.
*H01L 23/00* (2006.01)
*H01L 29/41* (2006.01)
(Continued)

(52) U.S. Cl.
CPC .............. *H01L 24/14* (2013.01); *H01L 24/13* (2013.01); *H01L 29/41* (2013.01); *H01L 24/11* (2013.01); *H01L 24/16* (2013.01); *H01L 24/81* (2013.01); *H01L 2224/0401* (2013.01); *H01L 2224/05624* (2013.01); *H01L 2224/05644* (2013.01); *H01L 2224/1134* (2013.01); *H01L 2224/11901* (2013.01); *H01L 2224/13005* (2013.01); *H01L 2224/1308* (2013.01); *H01L 2224/13012* (2013.01); *H01L 2224/13015* (2013.01); *H01L 2224/13017* (2013.01); *H01L 2224/13078* (2013.01); *H01L 2224/13139* (2013.01); *H01L 2224/13144* (2013.01); *H01L 2224/16227* (2013.01); *H01L 2224/81191* (2013.01); *H01L 2224/81205* (2013.01);
(Continued)

(58) Field of Classification Search
CPC ... H01L 2224/13078; H01L 2224/1134; H01L 2224/13075–13082; H01L 2224/14505; H01L 2224/13144; H01L 24/12; H01L 2224/05582; H01L 2224/05578; H05K 2201/0367

See application file for complete search history.

(56) References Cited

U.S. PATENT DOCUMENTS

| | | | |
|---|---|---|---|
| 2003/0057552 A1* | 3/2003 | Kainuma | H01L 21/563 257/737 |
| 2006/0055032 A1* | 3/2006 | Chang | H01L 21/4853 257/734 |
| 2013/0187277 A1* | 7/2013 | Chen | H01L 24/13 257/762 |

FOREIGN PATENT DOCUMENTS

| | | |
|---|---|---|
| JP | 2000-164619 | 6/2000 |
| JP | 2001-257229 | 9/2001 |

* cited by examiner

*Primary Examiner* — Charles D Garber
*Assistant Examiner* — Alia Sabur
(74) *Attorney, Agent, or Firm* — Fujitsu Patent Center

(57) ABSTRACT

A composite bump includes a plurality of first bumps that is metal-bonded to an electrode pad of a semiconductor chip, and a second bump that is metal-bonded to the plurality of first bumps.

A method for forming a composite bump, includes forming a plurality of first bumps to be metal-bonded to an electrode pad of a semiconductor chip, and forming a second bump to be metal-bonded to the plurality of first bumps.

11 Claims, 7 Drawing Sheets

(51) Int. Cl.
*H05K 3/34* (2006.01)
*H05K 3/32* (2006.01)
(52) U.S. Cl.
CPC ............... *H01L 2224/81801* (2013.01); *H01L 2224/81903* (2013.01); *H01L 2924/01079* (2013.01); *H01L 2924/3656* (2013.01); *H05K 3/328* (2013.01); *H05K 3/3436* (2013.01)

COMPOSITE BUMP, METHOD FOR FORMING COMPOSITE BUMP, AND SUBSTRATE

CROSS-REFERENCE TO RELATED APPLICATION

This application is based upon and claims the benefit of priority of the prior Japanese Patent Application No. 2017-97530, filed on May 16, 2017, the entire contents of which are incorporated herein by reference.

FIELD

The embodiments discussed herein are related to a composite bump, a method for forming a composite bump, and a substrate.

BACKGROUND

As electronic devices or electronic parts, those in each of which a semiconductor element called a chip is mounted on a substrate are generally used. A flip-chip method (FC method) is one of methods for mounting an element on a substrate. In the flip-chip method, a silicon chip and a metal electrode pad are connected to each other by a projecting terminal which is made of a metal composition and called a bump. When the silicon chip and the metal electrode pad are connected to each other by a bump, an alloy layer is generated in a connection interface each of between the bump and the chip and between the bump and the substrate, and electrical bonding may be caused. The flip-chip method is widely used since it is advantageous in that a mounting area is small, a gap between an element and a substrate is narrow, and electrical properties are favorable.

As more electronic parts are mounted by the flip-chip method, various sizes of chips or substrates are desired. For example, there is a problem in that conduction reliability in bonding deteriorates for the following reason.

In general, chips and substrates have different thermal expansion coefficients depending on the different materials or thicknesses. For this reason, after a substrate which is bonded to a chip by a bump is mounted in an electronic device, the chip and the substrate may be heated by heat inside the electronic device. When the electronic device is heated, the chip and the substrate warp, and a gap between the chip and the substrate becomes large. When the gap between the chip and the substrate becomes large, there is a problem that bonding between the chip and the substrate breaks and conduction is not obtained. This easily becomes prominent when the sizes of the chip and the substrate are large.

In addition, when the chip and the substrate are small, the size of the bump is decreased. Therefore, there is a problem that a contact area between the bump and the chip or substrate is decreased and it is difficult to obtain conduction.

In order to resolve this problem, a method for setting the bump to have a layered structure is used. However, in setting the bump to have a layered structure, it is desired to apply an energy for forming an alloy layer on the same location of the chip a plurality of times, so that there is a problem that destruction of the chip is caused as illustrated in FIG. 1B. In addition, when an energy for forming a bump is small, there is a problem that the bump is not bonded as illustrated in FIG. 1A. In this regard, in the suggestion, deterioration of conduction reliability in bonding due to warping of the substrate or miniaturization of the bump is not avoided.

Deterioration of conduction reliability in bonding between the chip and the substrate is also caused by a phenomenon in which a metal contained in the bump is diffused inside the alloy layer, erodes the alloy layer, and voids (hollows) are generated inside the alloy layer. When the voids are generated, a value of resistance of the alloy layer is increased and conduction reliability in bonding deteriorates.

In recent years, cases where electronic devices or electronic parts are used have been further increased, and also higher performance of the electronic parts has been desired. With this, materials used in substrates are changed. As the materials, materials (for example, SiC, GaN, and the like) that may increase outputs compared to silicon which has been used may be used. Along with these materials, materials of chips which are connected to bumps are also changed. For example, generation of voids becomes prominent when a bump containing gold is formed into a chip containing aluminum. Therefore, the current situation is that, with the present bump, it is difficult to maintain conduction reliability in bonding.

The followings are reference documents.
[Document 1] Japanese Laid-open Patent Publication No. 2001-257229 and
[Document 2] Japanese Laid-open Patent Publication No. 2000-164619.

SUMMARY

According to an aspect of the invention, a composite bump includes a plurality of first bumps that is metal-bonded to an electrode pad of a semiconductor chip, and a second bump that is metal-bonded to the plurality of first bumps.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Bump

Figure 1A:
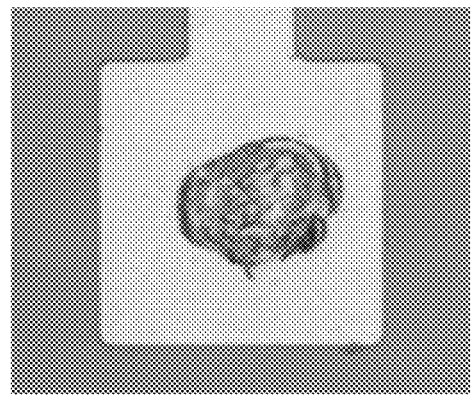
FIG. 1A is an exemplary photograph of a bump that is not bonded.
Figure 1B:
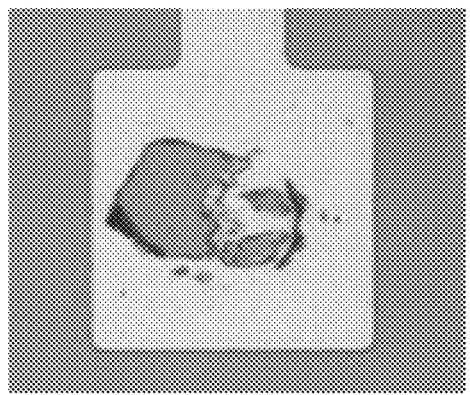
FIG. 1B is an exemplary photograph of a bump and a substrate that are taken off.

A bump according to the disclosure is a bump in which a plurality of first bumps and a second bump are metal-bonded to each other (hereinafter, referred to as composite bump). The plurality of first bumps is metal-bonded to an electrode pad of a chip. Metal bonding refers to physical bonding and electrical bonding.

First Bump

The plurality of first bumps is metal-bonded to the electrode pad of the chip.

Each of the first bump is metal-bonded to the second bump. All of the plurality of first bumps is preferably metal-bonded to the second bump, and at least two first bumps may be metal-bonded to the second bump.

The number of the first bumps is preferably two to four.

The first bump contains a principal component metal and further contains other components depending on the necessity.

The principal component metal contained in the first bump is the same as that of the second bump to be described.

The principal component metal contained in the first bump may be the same as or different from the principal component metal contained in the second bump. However, the principal component metal contained in the first bump is preferably the same as the principal component metal contained in the second bump. In a case where the principal component metal contained in the first bump is the same as that contained in the second bump, when metal-bonding the first bump and the second bump, it is possible to perform metal bonding with an energy smaller than the energy at the time of connecting the second bump to the electrode pad of the chip.

A content ratio (% by mass) of the principal component metal contained in the first bump is not particularly limited and may be appropriately selected depending on the purpose. However, the content ratio of the principal component metal contained in the first bump is preferably 99.00% by mass to 99.98% by mass. In addition, the content ratio of the principal component metal contained in the first bump is preferably smaller than a content ratio of the principal component metal contained in the second bump. The content ratio of the principal component metal contained in the first bump and the content ratio of the principal component metal contained in the second bump are compared with each other based on the same unit system (for example, when the content in the first bump is calculated in a unit of % by mass, the content in the second bump is also calculated in a unit of % by mass and compared therewith).

Other components contained in the first bump are not particularly limited and may be appropriately selected depending on the purpose. However, from a viewpoint of avoiding diffusion of the principal component metal, other components contained in the first bump preferably include silver, palladium, copper, and platinum.

By adjusting at least one of the relationship between the content ratio of the principal component metal contained in the first bump and the content ratio of the principal component metal contained in the second bump and the components other than the principal component metal contained in the first bump, it is possible to avoid diffusion of the principal component metal contained in the second bump.

Diffusion of the principal component metal refers to the following. In general, when the components contained in an electrode pad and the principal component metal of a bump create an alloy layer, the electrode pad and the bump are metal-bonded to each other. Immediately after the metal bonding, a volume of the alloy layer is significantly small compared to a volume of the bump. However, depending on bump forming conditions, a reaction between the components contained in the electrode pad and the principal component metal proceeds and the volume of the alloy layer is increased. This phenomenon that reaction of the principal component metal after bump formation further proceeds is called the diffusion of the principal component metal.

It is known that when the volume of the alloy layer is increased, voids are generated in the alloy layer. When the voids are generated, a value of resistance between the substrate and the bump is increased, and physical adhesion between the substrate and the bump may become weak. For this reason, avoiding diffusion of the principal component metal is important in the bump formation.

A projected area equivalent circular diameter of the first bump is the maximum value of projected area equivalent circular diameters of the plurality of first bumps.

Second Bump

The second bump contains the principal component metal and further contains other components depending on the necessity.

The principal component metal is not particularly limited as long as the principal component metal is a material generally used in bumps and may be appropriately selected depending on the purpose. However, from a viewpoint of conductivity, corrosion resistance, and the like, the principal component metal is preferably gold.

A content ratio of the principal component metal contained in the second bump is not particularly limited and may be appropriately selected depending on the purpose. However, the content ratio of the principal component metal contained in the second bump is preferably greater than the content ratio of the principal component metal contained in the first bump described above.

In the present specification, the "principal component" is a component of which the content ratio is the maximum among the components contained in the second bump or the first bump described above. In the present specification, the "principal component metal" is defined as a metal of which the content ratio is the maximum among the metals contained in the second bump or the first bump described above. The content ratio of the principal component metal is also called purity.

Other components include silver and the like, for example.

Figure 2A:
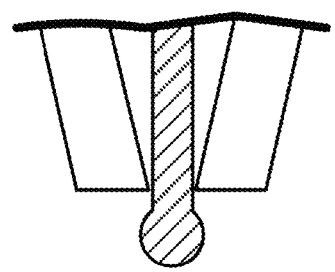
FIG. 2A is an exemplary schematic view of forming a bump according to the disclosure.
Figure 2B:
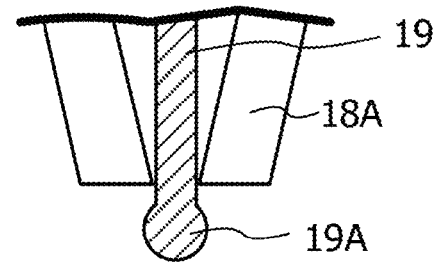
FIG. 2B is an exemplary schematic view of forming the bump according to the disclosure.
Figure 2C:
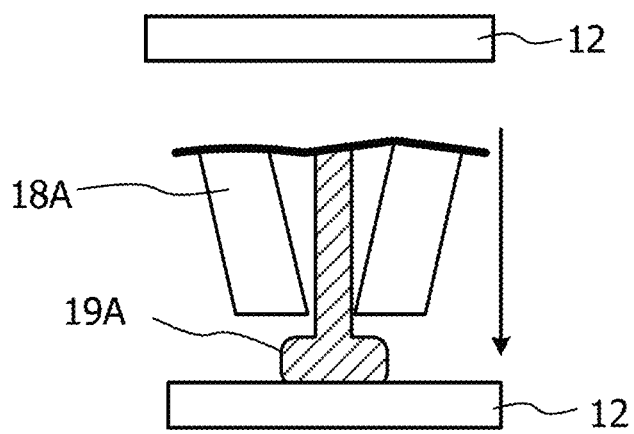
FIG. 2C is an exemplary schematic view of forming the bump according to the disclosure.
Figure 2D:
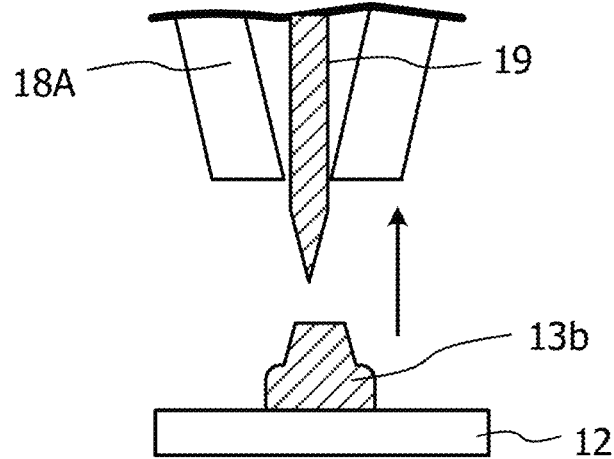
FIG. 2D is an exemplary schematic view of forming the bump according to the disclosure.

A shape of the second bump is not particularly limited as long as the shape is a shape of a general bump and may be appropriately selected depending on the purpose. In general, bumps have a conic shape as illustrated in FIG. 2D.

A size of the second bump is not particularly limited as long as the size is a size of a general bump and may be appropriately selected depending on the purpose. The size is based on a projected area equivalent diameter. The projected area equivalent diameter of a general bump is substantially in a range of 30 μm to 85 μm.

The projected area equivalent circular diameter of the second bump is preferably equal to or more than the projected area equivalent circular diameter of the first bump described above.

The projected area equivalent circular diameter (projected area diameter) is defined as a diameter of a circle having the same area as the projected area of a measured particle. Since this definition was first suggested by Heywood, the projected area equivalent circular diameter is also called Heywood Diameter.

As a method for measuring a projected area equivalent circular diameter, general devices or programs for use in measurement of a particle and the like may be used. For example, the projected area equivalent circular diameter may be acquired by performing image treatment on a photo image obtained by imaging the second bump using an optical microscope. Since the optimum magnification varies by a targeted particle diameter, any microscope may be used.

Chip

The chip includes an electrode pad.

The material, the size, the shape, and the like of the chip are not particularly limited as long as the chip is a generally used chip and may be appropriately selected depending on the purpose.

The material of the electrode pad is not particularly limited as long as the material is a conductive composition and may be appropriately selected depending on the purpose. Examples of the material include aluminum, gold, and the like.

The shape of the electrode pad is not particularly limited and may be appropriately selected depending on the purpose. However, the shape of the electrode pad is preferably a planar shape.

The size of the electrode pad is not particularly limited and may be appropriately selected depending on the purpose. However, the size is preferably in a range of 40 μm square to 120 μm square.

An average thickness of the electrode pad is not particularly limited and may be appropriately selected depending on the purpose. However, the average thickness is preferably in a range of 1 μm to 3 μm.

A position of the electrode pad is not particularly limited and may be appropriately selected depending on the purpose.

Method for Forming Bump

A method for forming a bump according to the disclosure is the method for forming a composite bump described above. The method for forming a bump includes a second bump formation step and a first bump formation step, and other steps depending on the necessity. The second bump formation step is performed after the first bump formation step.

First Bump Formation Step

The first bump formation step is a step forming the plurality of first bumps such that the plurality of first bumps are metal-bonded to the electrode pad of the chip. A method for the first bump formation step is not particularly limited as long as the method is a general bump formation method and may be appropriately selected depending on the purpose. For example, as described above, the bump may be formed by the ball bonding using a metal wire.

In the ball bonding using a metal wire, when the metal wire and the electrode pad are bonded (metal bonding) to each other, heat, an ultrasonic wave, and a load are applied to the electrode pad. At this time, the following five conditions are appropriately adjusted and the energy applied to the electrode pad is adjusted.

1. A temperature of a portion ("electrode pad") in which a bump is formed
 2. An output of an ultrasonic wave (vibration frequency)
 3. A time for which an ultrasonic wave is applied
 4. Magnitude of a load
 5. A time for which a load is applied If the condition (energy) is great, there is a case where the electrode pad may be damaged, and if the condition is small, there is a case where the bump is not attached to the electrode pad. In addition, the energy is proportional to the size of the bump (projected area equivalent circular diameter) to some extent. That is, when a great bump is formed, a great energy is desired, and when a small bump is formed, the bump may be formed with a small energy.

When the size (projected area equivalent circular diameter) of the first bump is smaller than the size of the second bump, it is possible to avoid damage of the electrode pad at the time of the formation of the first bump.

Second Bump Formation Step

The second bump formation step is a step forming the second bump such that the second bump is metal-bonded to the plurality of first bumps. The second bump is preferably formed so as to be metal-bonded to at least two first bumps. The second bump is more preferably formed to be metal-bonded to each of the plurality of first bumps.

A method for the second bump formation step is not particularly limited as long as the method is a general bump formation method and may be appropriately selected depending on the purpose. Specifically, the second bump may be formed as follows, for example.

So as to be at the center of the plurality of first bumps, the second bump is formed by the ball bonding using a metal wire, in the same manner as in the formation of the first bump.

The second bump may be in contact with the electrode pad of the chip, or the second bump may be not in contact therewith.

When the second bump is in an aspect of being in contact with the electrode pad of the chip, a vibration direction of an ultrasonic wave in the second bump formation step is preferably a direction orthogonal to a line linking adjacent two first bumps.

In a case where the principal component metal of the second bump and the principal component metal of the first bump are the same as each other, an energy for forming the second bump is smaller than an energy for forming the second bump directly in the electrode pad. The first bump formation is to create an alloy layer between a metal wire being the material of the bump and a chip (metal-bonded). On the other hand, the second bump formation is metal bonding between the principal component metal contained in the second bump and the principal component metal contained in the first bump. In metal bonding using the same type of metals and metal bonding using the different type of metals, the metal bonding using the same type of metals is performed with a smaller energy. For this reason, compared to forming the second bump directly in the electrode pad, in forming the second bump on the first bump smaller than the second bump, the electrode pad is not damaged and a bump having a great size and high conduction reliability may be formed.

In addition, since a plurality of first bumps is formed, the energy at the time of the second bump formation may be diffused in the plurality of first bumps. For this reason, it is possible to avoid damage of the electrode pad.

Other Steps

Other steps are not particularly limited and may be appropriately selected depending on the purpose. Examples of the other steps include a step for cleansing a formed composite bump.

Substrate

The substrate according to the disclosure is a substrate in which the above-described composite bump is electrically connected to the electrode pad of the chip and a substrate main body. The second bump adheres to the substrate main body, and the first bump is metal-bonded to the electrode pad of the chip.

The composite bump has the above-described features.

When the second bump is electrically bonded, the second bump may be metal-bonded to the substrate main body, or the second bump may physically adhere thereto.

Substrate Main Body

The substrate main body is not particularly limited as long as the substrate main body may be electrically connected to the composite bump and may be appropriately selected depending on the purpose. Examples of the substrate main body include a conductive composition, a print substrate, and the like. In addition, the substrate main body may be a substrate main body in which an electrode pad is formed. In this case, the second bump preferably adheres to the electrode pad of the substrate main body.

Method for Manufacturing Substrate

A Method for manufacturing a substrate includes a second bump formation step, a first bump formation step, and an adhesion step. The second bump formation step and the first bump formation step are as described above.

Adhesion Step

The adhesion step is a step for adhering the second bump to the substrate main body.

A method for adhering the second bump to the substrate main body is not particularly limited as long as the method is a method generally used for mounting in a substrate and may be appropriately selected depending on the purpose. Examples of the method for adhering the second bump to the substrate main body include ultrasonic wave bonding that performs crimping using an ultrasonic wave, adhesive fixing that performs adhesion using an adhesive, solder bonding that performs adhesion using a solder, and the like.

EXAMPLES

Hereinafter, examples of the embodiments are explained but the embodiments are not limited to the examples.

Example 1

A bump having two first bumps and one second bump was formed on an aluminum substrate (hereinafter, referred to as electrode pad) having an average thickness of 1 μm and a size of 100 μm square as follows.

Formation of a first bump 13b was performed by ball bonding using a metal wire. That is, as illustrated in FIG. 2A, a tip end of a wire 19 (wire diameter of 20 μm, 99% by mass of purity of gold, silver is also contained) containing gold as a principal component metal and drawn out from bonding capillaries 18A, was melt into a ball shape using a high voltage (spark) to form a ball portion 19A. As illustrated in FIG. 2B, the ball portion 19A was brought into contact with an electrode pad 12 on a semiconductor chip (not illustrated). As illustrated in FIG. 2C, a load and an ultrasonic wave were applied to the ball portion 19A by the bonding capillaries 18A in an arrow direction in the drawing to bond (metal bonding) the wire to the electrode pad 12. After the bonding, as illustrated in FIG. 2D, by pulling up the bonding capillaries 18A in a vertical direction and pulling up the wire 19, one of two first bumps 13b was formed.

Figure 3A:
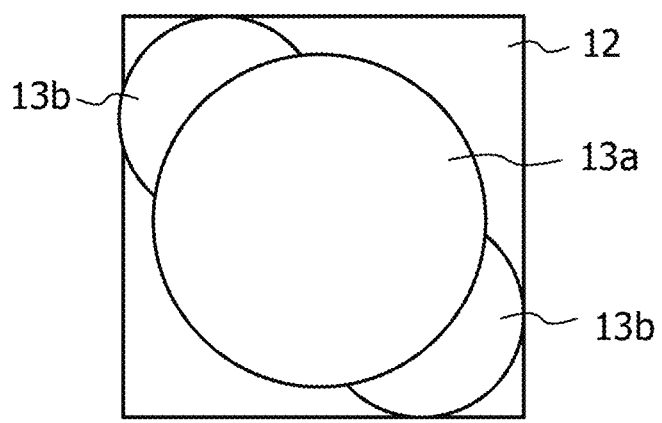
FIG. 3A is a schematic top view of a bump of Example 1, which is an example of the bump according to the disclosure.

After forming the one of first bumps 13b, by the same method as above, as illustrated in FIG. 3A, the other one of the first bumps 13b was formed so as to be at a diagonal position to a position of the one of the first bumps 13b on the electrode pad.

Figure 3B:
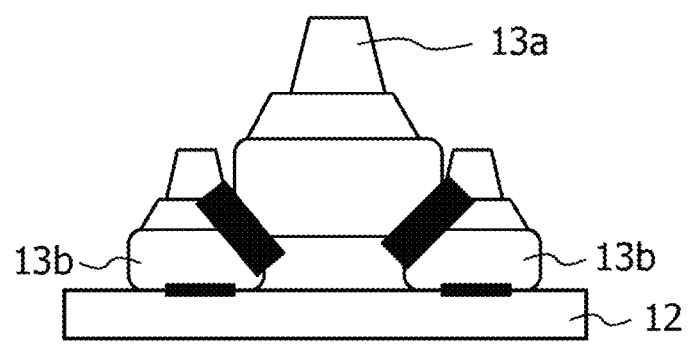
FIG. 3B is a schematic side view of the bump of Example 1, which is the example of the bump according to the disclosure.

After forming the two first bumps 13b, a second bump was formed at a position illustrated in FIG. 3A so as not to be in contact with the electrode pad by the ball bonding using a metal wire. A content ratio of the principal component metal of the second bump was greater than a content ratio of the principal component metal of the first bump. A schematic side view of the bump of Example 1 is illustrated in FIG. 3B. Among black bold lines in FIG. 3B, the thick black lines illustrate metal bonding in which an alloy layer of aluminum and gold is formed and the light black lines illustrate metal bonding between gold.

Conditions of the projected area equivalent circular diameters (bump diameters) of the second bump and the first bump, the loads and the ultrasonic waves applied at the time of forming respective bumps, and the temperatures are illustrated in Table 1.

TABLE 1

| | First bump | Second bump |
| --- | --- | --- |
| Temperature at the time of forming the bump (° C.) | 200 | 200 |
| Ultrasonic wave output | 170 | 170 |
| Time for which an ultrasonic wave was applied (ms) | 8 | 8 |
| Magnitude of the load (g) | 15 | 15 |
| Time for which the load was applied (ms) | 8 | 8 |
| Bump diameter (μm) | 45 | 30 |

In the bump of Example 1, since the first bump was smaller than the second bump, there was a plurality of first bumps, and the energy at the time of forming the second bump could be distributed, damage of the electrode pad was not caused. In addition, since the first bump contains a smaller amount of the principal component metal (gold) than the second bump, and contains silver, it was possible to avoid diffusion of the principal component metal from the second bump. Therefore, a bump having high conduction reliability in bonding could be formed.

Example 2

Figure 4A:
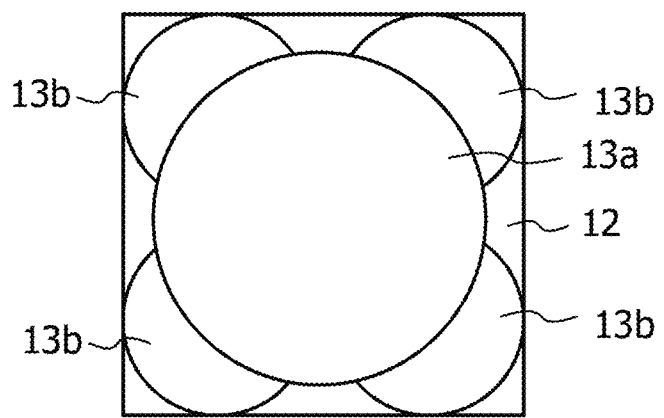
FIG. 4A is a schematic top view of a bump of Example 2, which is an example of the bump according to the disclosure.

A bump having four first bumps and one second bump was formed on an aluminum substrate (hereinafter, referred to as electrode pad) having an average thickness of 1 μm and a size of 100 μm square, as illustrated in FIG. 4A, by ball bonding using a metal wire, in the same manner as in Example 1. The second bump was not in contact with the electrode pad.

Figure 4B:
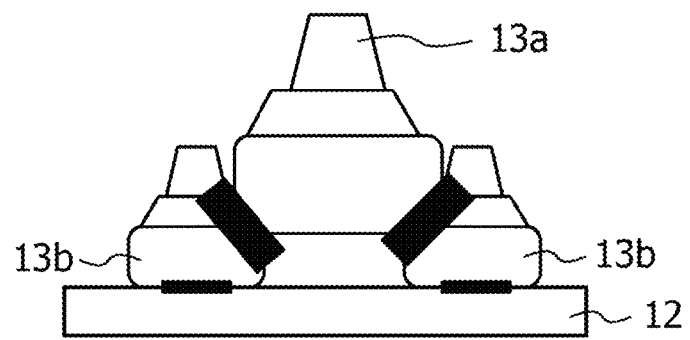
FIG. 4B is a schematic side view of the bump of Example 2, which is the example of the bump according to the disclosure.

A schematic side view of the bump of Example 2 is illustrated in FIG. 4B. Among black bold lines in FIG. 4B, the thick black lines illustrate metal bonding in which an alloy layer of aluminum and gold is formed and the light black lines illustrate metal bonding between gold.

Conditions of the projected area equivalent circular diameters (bump diameters) of the second bump and the first bump, the loads and the ultrasonic waves applied at the time of forming respective bumps, and the temperatures are illustrated in Table 2.

TABLE 2

|  | First bump | Second bump |
|---|---|---|
| Temperature at the time of forming the bump (° C.) | 200 | 200 |
| Ultrasonic wave output | 250 | 170 |
| Time for which an ultrasonic wave was applied (ms) | 28 | 8 |
| Magnitude of the load (g) | 29 | 15 |
| Time for which the load was applied (ms) | 28 | 8 |
| Bump diameter (μm) | 65 | 30 |

In the bump of Example 2, since the first bump was smaller than the second bump, there was a plurality of first bumps, and the energy at the time of forming the second bump could be distributed, damage of the electrode pad was not caused. In addition, since the first bump contains a smaller amount of the principal component metal (gold) than the second bump, and contains silver, it was possible to avoid diffusion of the principal component metal from the second bump. Therefore, a bump having high conduction reliability in bonding could be formed.

Example 3

Figure 5A:
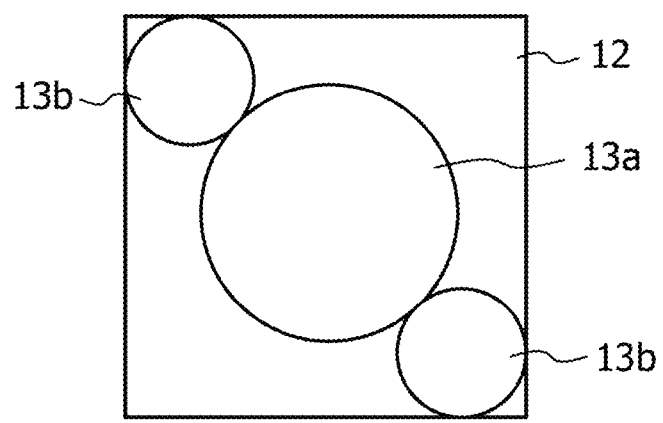
FIG. 5A is a schematic top view of a bump of Example 3, which is an example of the bump according to the disclosure.

A bump having two first bumps and one second bump was formed on an aluminum substrate (hereinafter, referred to as electrode pad) having an average thickness of 1 μm and a size of 100 μm square, as illustrated in FIG. 5A, by ball bonding using a metal wire, in the same manner as in Example 1. The second bump was in contact with the electrode pad.

Figure 5B:
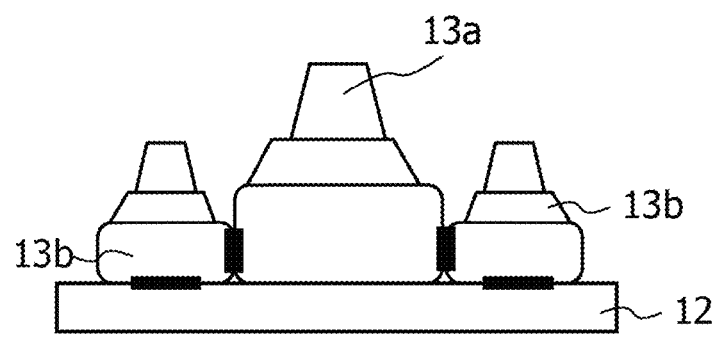
FIG. 5B is a schematic side view of the bump of Example 3, which is the example of the bump according to the disclosure.

A schematic side view of the bump of Example 3 is illustrated in FIG. 5B. Among black bold lines in FIG. 5B, the thick black lines illustrate metal bonding in which an alloy layer of aluminum and gold is formed and the light black lines illustrate metal bonding between gold.

Conditions of the projected area equivalent circular diameters (bump diameters) of the second bump and the first bump, the loads and the ultrasonic waves applied at the time of forming respective bumps, and the temperatures are illustrated in Table 3.

TABLE 3

|  | First bump | Second bump |
|---|---|---|
| Temperature at the time of forming the bump (° C.) | 200 | 200 |
| Ultrasonic wave output | 170 | 170 |
| Time for which an ultrasonic wave was applied (ms) | 8 | 8 |
| Magnitude of the load (g) | 15 | 15 |
| Time for which the load was applied (ms) | 8 | 8 |
| Bump diameter (μm) | 45 | 30 |

In the bump of Example 3, since the second bump was bonded only to the first bump and the second bump was only in contact with the electrode pad (an alloy layer between the second bump and the electrode pad was not formed), the energy at the time of forming the second bump could be distributed to the first bump and damage of the electrode pad was not caused. In addition, since the first bump contains a smaller amount of the principal component metal (gold) than the second bump, and contains silver, it was possible to avoid diffusion of the principal component metal from the second bump. Therefore, a bump having high conduction reliability in bonding could be formed.

The application example in a case where the chip having the composite bump of the embodiments are mounted on the substrate main body is explained with reference to FIGS. 6 and 7.

Figure 6:
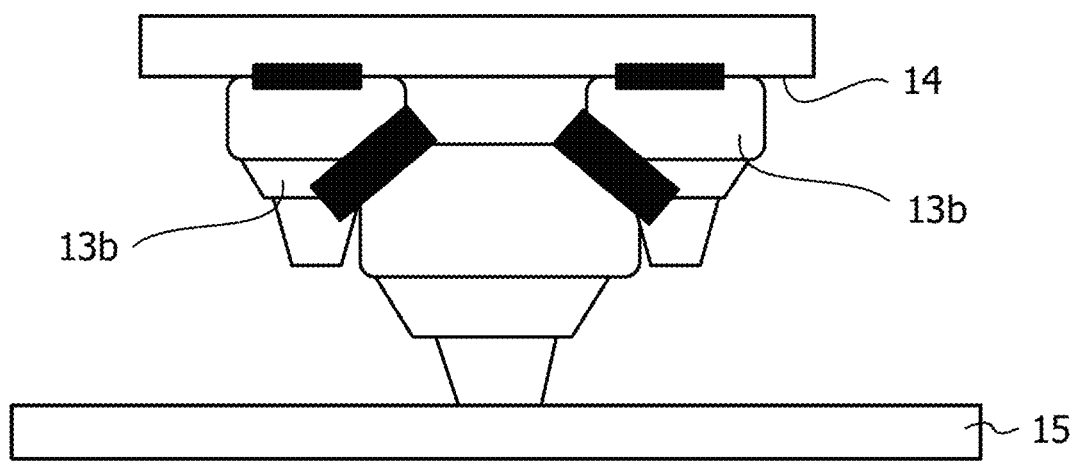
FIG. 6 is an exemplary schematic side view of a bump according to an application example of the disclosure.

FIG. 6 is a view in a case of using ultrasonic wave bonding. FIG. 6 illustrates a state in which a chip 14 including a composite bump made of a second bump 13a and a plurality of first bumps 13b on an electrode pad (not illustrated) is mounted on a substrate main body 15. Here, the second bump adheres to the substrate main body by ultrasonic wave bonding. The first bumps are metal-bonded to the electrode pad of the chip. In this aspect, even in a case where the substrate main body and the chip are pressure-bonded to each other, a pressure (stress) applied to the chip (electrode pad) may be received by the plurality of first bumps. For this reason, the stress is distributed, damage of the electrode pad may be avoided, and bonding reliability is improved.

Figure 7:
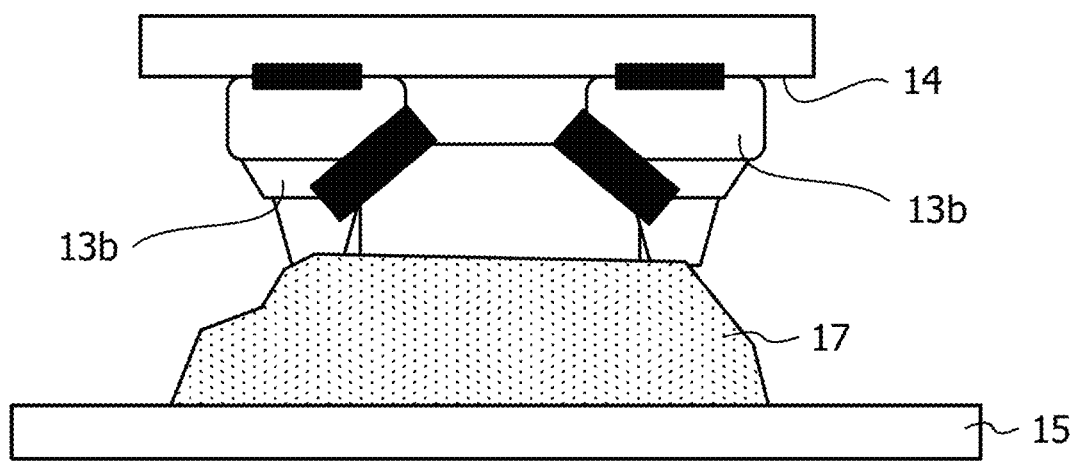
FIG. 7 is an exemplary schematic side view of a bump according to an application example of the disclosure.

FIG. 7 is a view in a case of using solder bonding. FIG. 7 illustrates a state in which the chip 14 including a composite bump made of the second bump 13a and the plurality of first bumps 13b on the electrode pad (not illustrated) is mounted on the substrate main body 15. In addition, a FIG. 17 colored in light grey between the chip and the substrate represents a solder. Here, the second bump is in contact with the solder and the substrate main body. The first bumps are metal-bonded to the electrode pad of the chip.

In general, solder bonding is frequently performed when mounting the chip including the bump on the electrode pad in a semiconductor and the like. However, it is known that bonding breaks when a solder adheres to an electrode pad including aluminum, in particular. In addition, in a case where the principal component metal contained in the bump according to the disclosure is gold, when the solder is in contact with the bump, a phenomenon is caused in which the principal component metal reacts with the solder, the solder is eroded into the bump, and the bump is absorbed (also called "swallowed") in the solder. As a result, the solder in which the bump is swallowed adheres to the electrode pad In the bump according to the disclosure, since the content ratio of the principal component metal of the first bump 13b is smaller than that of the second bump 13a, the above-described swallowing of the solder tends not to occur. That is, even if a phenomenon is caused in which the second bump is swallowed in the solder, connection is maintained since the first bump is not swallowed. Therefore, reliability of solder bonding may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A composite bump comprising:
   two first bumps that are metal-bonded to an electrode pad of a semiconductor chip, the electrode pad having a square shape; and a second bump that is metal-bonded to the two first bumps, the two first bumps are provided at respective two diagonal corners of the electrode pad, and the second bump is provided between the first bumps in such a manner that the second bump is in contact with each of the two first bumps, the second bump is in contact with each of the two first bumps at respective portions of a bottom surface of the second bump and is not in contact with the electrode pad.

2. The composite bump according to claim 1, wherein each of the two first bumps contains a principal component metal, and contains at least any one of silver, palladium, copper, and platinum, in addition to the principal component metal.

3. The composite bump according to claim 2, wherein the second bump contains a same metal as the principal component metal contained in each of the two first bumps, as a principal component metal, and wherein a content ratio of the principal component metal contained in each of the two first bumps is smaller than a content ratio of the principal component metal contained in the second bump.

4. The composite bump according to claim 2, wherein the principal component metal in each of the two first bumps is gold.

5. The composite bump according to claim 1, wherein a projected area equivalent circular diameter of the second bump is equal to or greater than a maximum projected area equivalent circular diameter among projected area equivalent circular diameters for the two first bumps.

6. A method of forming a composite bump, comprising:

forming two first bumps over an electrode pad of a semiconductor chip, the electrode pad having a square shape, in such a manner that the two first bumps are provided at respective two diagonal corners of the electrode pad and are metal-bonded to the electrode pad; and forming a second bump between the first bumps in such a manner that the second bump is in contact with each of the two first bumps and is metal-bonded to the two first bumps, the second bump is in contact with each of the two first bumps at respective portions of a bottom surface of the second bump and is not in contact with the electrode pad.

7. The method of forming a composite bump according to claim 6, wherein each of the two first bumps contains a principal component metal, and contains at least any one of silver, palladium, copper, and platinum, in addition to the principal component metal.

8. The method of forming a composite bump according to claim 7, wherein the second bump contains a same metal as the principal component metal contained in each of the two first bumps, as a principal component metal, and wherein a content ratio of the principal component metal contained in each of the two first bumps is smaller than a content ratio of the principal component metal contained in the second bump.

9. The method of forming a composite bump according to claim 6, wherein a projected area equivalent circular diameter of the second bump is equal to or greater than a maximum projected area equivalent circular diameter among projected area equivalent circular diameters for the two first bumps.

10. A substrate comprising:

a semiconductor chip; and a bump configured to couple the semiconductor chip to the substrate, the bump includes:

two first bumps that are metal-bonded to an electrode pad of the semiconductor chip, the electrode pad having a square shape; and a second bump that is metal-bonded to the two first bumps, the two first bumps are provided at respective two diagonal corners of the electrode pad, and the second bump is provided between the first bumps in such a manner that the second bump is in contact with each of the two first bumps, the second bump is in contact with each of the two first bumps at respective portions of a bottom surface of the second bump and is not in contact with the electrode pad.

11. The substrate according to claim 10, wherein the second bump is bonded to an electrode pad of the substrate by ultrasonic wave bonding.

* * * * *